United States Patent
Nogami et al.

(10) Patent No.: US 8,586,468 B2
(45) Date of Patent: Nov. 19, 2013

(54) INTEGRATED CIRCUIT CHIP STACK EMPLOYING CARBON NANOTUBE INTERCONNECTS

(75) Inventors: Takeshi Nogami, Hopewell Junction, NY (US); Masanaga Fukasawa, Fishkill, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1353 days.

(21) Appl. No.: 11/210,586

(22) Filed: Aug. 24, 2005

(65) Prior Publication Data

US 2007/0045762 A1 Mar. 1, 2007

(51) Int. Cl.
*H01L 21/28* (2006.01)

(52) U.S. Cl.
USPC ............ 438/618; 438/637; 977/734; 977/742

(58) Field of Classification Search
USPC ........... 257/459; 977/932, 734, 742; 438/675, 438/629, 672, 618, 637
See application file for complete search history.

(56) References Cited

U.S. PATENT DOCUMENTS

| | | | | |
|---|---|---|---|---|
| 6,924,222 | B2 | 8/2005 | Goodner et al. ............. 438/622 |
| 7,094,679 | B1 * | 8/2006 | Li et al. .......... 438/618 |
| 2001/0033509 | A1 | 10/2001 | Ahn et al. ....... 365/63 |
| 2002/0064592 | A1 | 5/2002 | Datta et al. ....... 427/98 |
| 2002/0081381 | A1 | 6/2002 | DelaRosa et al. ........ 427/255.28 |
| 2002/0163079 | A1 * | 11/2002 | Awano ........... 257/750 |
| 2003/0082845 | A1 | 5/2003 | Hoffman et al. ............. 438/106 |
| 2003/0102797 | A1 * | 6/2003 | Kajiwara ....... 313/486 |
| 2003/0143837 | A1 | 7/2003 | Gandikota et al. .......... 438/629 |
| 2003/0171837 | A1 * | 9/2003 | Yamazaki et al. ........... 700/121 |
| 2003/0210103 | A1 | 11/2003 | Park et al. ........ 333/1 |
| 2003/0218253 | A1 | 11/2003 | Avanzino et al. ............ 257/758 |
| 2004/0005753 | A1 | 1/2004 | Kostamo et al. ............. 438/222 |
| 2004/0094402 | A1 | 5/2004 | Gopalraja et al. ........ 204/192.12 |
| 2004/0099952 | A1 | 5/2004 | Goodner et al. ............. 257/758 |
| 2004/0102006 | A1 | 5/2004 | Xu et al. ....... 438/259 |
| 2004/0113222 | A1 | 6/2004 | Ozguz et al. ............ 257/459 |
| 2004/0130027 | A1 | 7/2004 | Chen et al. ...... 257/758 |
| 2004/0152240 | A1 * | 8/2004 | Dangelo ....... 438/122 |
| 2004/0161922 | A1 | 8/2004 | Gallagher et al. ........... 438/623 |
| 2004/0185679 | A1 | 9/2004 | Ott et al. ......... 438/781 |
| 2004/0207091 | A1 | 10/2004 | Wang et al. ........... 257/758 |
| 2004/0253805 | A1 | 12/2004 | Dubin et al. ........... 438/618 |
| 2005/0059234 | A1 | 3/2005 | Bera et al. ............ 438/633 |
| 2005/0062034 | A1 | 3/2005 | Dubin ........... 257/20 |
| 2005/0079706 | A1 | 4/2005 | Kumar et al. ......... 438/638 |
| 2005/0088647 | A1 | 4/2005 | Shanmugasundram et al. ............ 356/72 |
| 2005/0093155 | A1 | 5/2005 | Kahlert et al. ........... 257/751 |
| 2005/0110145 | A1 | 5/2005 | Elers ............ 257/758 |
| 2005/0118807 | A1 | 6/2005 | Kim et al. ...... 438/686 |
| 2005/0139948 | A1 | 6/2005 | Chung et al. ............ 257/486 |
| 2005/0142853 | A1 | 6/2005 | Tu ............ 438/624 |
| 2005/0189655 | A1 * | 9/2005 | Furukawa et al. ............ 257/762 |

OTHER PUBLICATIONS

"Carbon nanotubes for interconnect applications," Kreup, F.; Graham, A.P.; Liebau, M.; Duesberg, G.S.; Seidel, R.; Unger, E. ; Electron Devices Meeting, 2004. IEDM Technical Digest. IEEE International, vol., Iss., Dec. 13-15, 2004; pp. 683-686.*

* cited by examiner

*Primary Examiner* — Douglas King

(74) *Attorney, Agent, or Firm* — Karin L. Williams; Stuart H. Mayer; Mayer & Williams PC

(57) ABSTRACT

An arrangement of semiconductor chips is provided. The arrangement includes a plurality of stacked semiconductor chips each including an integrated circuit. At least one via is formed through the thickness of at least one of the semiconductor chips. A carbon nanotube conductor is formed in the via. The conductor has first and second opposite ends. The first end of the conductor is selectively interconnected with the integrated circuit of its semiconductor chip and the second end of the conductor is selectively interconnected with the integrated circuit of another of the semiconductor chips.

6 Claims, 1 Drawing Sheet

INTEGRATED CIRCUIT CHIP STACK EMPLOYING CARBON NANOTUBE INTERCONNECTS

FIELD OF THE INVENTION

The present invention relates generally to the field of integrated circuits and, in particular, to stacked integrated circuits that are interconnected using vertically oriented vias.

BACKGROUND OF THE INVENTION

Integrated circuits form the basis for many electronic systems. An integrated circuit typically includes a large number of transistors and other active and passive circuit elements that are formed on a single semiconductor die or chip and are interconnected to implement a desired function. The complexity of these integrated circuits requires the use of an ever increasing number of linked transistors and other circuit elements. For instance, ultra-large scale integration (ULSI) integrated circuits may have more than a million logic gates on a single chip.

Provisions must be made to electrically connect a die to the printed circuit board with which it is used and also to protect the die from damage or other external conditions that could hinder its operation. Package engineering, or packaging, is the field within semiconductor engineering that addresses these needs. Integrated circuits are generally mounted on printed circuit boards in "packages," i.e., structures that provide an electrical interface with a printed circuit board and also protect a bare die and its electrical interconnects from damage, including damage due to moisture, vibration, and impact. A packaged die is generally attached to a metal leadframe or a substrate, electrically connected to the leadframe or substrate, and encapsulated with a ceramic enclosure or plastic "mold compound" for protection.

Occasionally, conventional packaging solutions may not afford adequate space savings on a printed circuit board. Especially in the case of memory devices, the functionality of multiple dies may be required while space for only one packaged die is available on a board. In such cases, using a "multi-chip module" (MCM), or single package containing multiple dies, is often considered. In some MCM's, dies are arranged side-by-side on a single substrate. However, depending on the application, this approach may not provide significant space savings over simply packaging multiple dies separately, a more common assembly process. Accordingly, it may be desired to stack multiple dies within a single package.

There are several benefits to stacked die packages. More functionality within a given area of board space may be achieved, since more silicon functions per area of board space (and per unit volume of application space) are possible. Eliminating individual packages for each die can contribute to significant size and weight reductions of printed circuit boards and electronic devices in which they are installed. Including two or more dies in one package decreases the number of components mounted on an application board, potentially reducing overall system cost. In addition, providing a single package for package assembly, electrical testing and handling may reduce manufacturing costs.

There have been numerous techniques developed for interconnecting a number of dies in a stack to form a system module. For instance, in U.S. Appl. Serial No. 2004/0113222, one or more vertical interconnect vias are formed in the individual integrated circuit dies to allow the subsequent interconnect of the die when they are stacked. The vias are filled with tungsten to form the interconnects. In other cases the vias are filled with copper.

While there are numerous advantages to a stacked die configuration, there are also associated problems. Specifically, larger and larger stacks create cooling problems. Because the chip stacks contain multiple dies, they generate more heat per unit volume, requiring greater heat dissipation, while at the same time providing significantly smaller surface areas which may be used as a heat sink. While vias filled with copper can ameliorate this problem to some extent by dissipating the heat to the surface of the die, the thermal conductivity of copper is nevertheless in many cases not sufficiently high to eliminate the problem of cooling. Another problem that arises when copper is employed is the relatively long time that is required to grow the bulk copper. For example, if a copper electroplating process is employed, it may take upwards of an hour to fill a via that is several hundred microns is depth.

SUMMARY OF THE INVENTION

In accordance with the present invention, an arrangement of semiconductor chips is provided. The arrangement includes a plurality of stacked semiconductor chips each including an integrated circuit. At least one via is formed through the thickness of at least one of the semiconductor chips. A carbon nanotube conductor is formed in the via. The conductor has first and second opposite ends. The first end of the conductor is selectively interconnected with the integrated circuit of its semiconductor chip and the second end of the conductor is selectively interconnected with the integrated circuit of another of the semiconductor chips.

In accordance with one aspect of the invention, a catalyst layer is formed in the via and on the surface of the other semiconductor chip. The carbon nanotube conductor is disposed on the catalyst layer.

In accordance with another aspect of the invention, a bond pad is located on the first end of the carbon nanotube conductor.

In accordance with another aspect of the invention, a conductive interconnect electrically couples the bond pad to a conductive interconnect region of the semiconductor chip in which the via is located.

In accordance with another aspect of the invention, a method is provided for interconnecting a plurality of semiconductor chips. The method begins by forming at least one via through the thickness of at least a first one of the semiconductor chips. The first semiconductor chip is vertically stacked over a second semiconductor chip such that a bottom of the via is exposed to a conductive interconnect region of the second semiconductor chip. A catalyst layer is formed at the bottom of the via. The catalyst layer is electrically interconnected to a conductive interconnect region of the second semiconductor chip. The via is filled with a carbon nanotube conductor and electrically interconnected to a conductive interconnect region of the first semiconductor chip.

In accordance with another aspect of the invention, an interface defined by the carbon nanotube conductor and the catalyst layer is annealed.

In accordance with another aspect of the invention, the annealing step is performed by a laser beam.

In accordance with another aspect of the invention, the laser beam is applied to a surface of the carbon nanotube conductor.

In accordance with another aspect of the invention, the step of filling the via with the carbon nanotube conductor comprises filling the via partway and performing the annealing step before filling a remaining portion of the via.

In accordance with another aspect of the invention, the step of filling the via with the carbon nanotube conductor comprises using a CVD process to fill the via.

DETAILED DESCRIPTION

The methods and structures described herein do not form a complete process for manufacturing semiconductor device structures. The remainder of the process is known to those of ordinary skill in the art and, therefore, only the process steps and structures necessary to understand the present invention are described herein.

The present invention can be applied to microelectronic devices, such as highly integrated circuit semiconductor devices (e.g., ULSI integrated circuits), processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Figure 1:
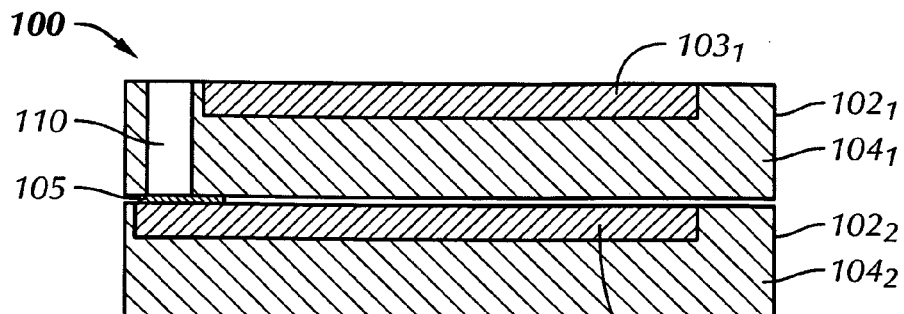
FIG. 1 is a cross-sectional view of one embodiment of a stacked integrated circuit arrangement constructed in accordance with the present invention.

FIG. 1 is a cross-sectional view of one embodiment of a stacked integrated circuit arrangement constructed in accordance with the present invention. The arrangement 100 includes a plurality of semiconductor dies or chips $102_1$ and $102_2$ that are disposed and interconnected in a stack to provide "chip-sized" packaging. While FIG. 1 only shows 2 such dies, those of ordinary skill in the art will recognize that the invention encompasses arrangements in which any number of dies are stacked together. Each semiconductor die $102_1$ and $102_2$ includes a substrate $104_1$ and $104_2$, respectively, in which one more levels of active and/or passive semiconductor devices are formed. The substrates may be, for example, silicon substrates, silicon on insulator (SOI) substrates, gallium arsenic substrates, silicon germanium substrates, ceramic substrates, quartz substrates, or glass substrates for display. The stacked dies $102_1$, and $102_2$ may be physically connected to one another by a suitable adhesive such as a polyimide.

Each die $102_1$ and $102_2$ respectively includes an interconnect region $103_1$ and $103_2$ that comprises multiple metallization layers for providing interconnections to the various levels of the semiconductor devices located within each die. One or more vias are formed at predetermined locations in the dies to interconnect the interconnect region of one die to the interconnect region of the other dies. For example, in FIG. 1, via 110 is shown in die $102_1$ for interconnecting die $102_1$ to die $102_2$. The vias may be about 70 nm or more in diameter and extend completely through the substrate. Since the substrates typically have a thickness in the range of about 500-1000 microns, the vias will generally have high aspect ratios (e.g., 100-200). The vias may be formed using industry standard dry etch or laser drill techniques, for example, depending on the substrate material. More generally, any process may be employed that is capable of creating high aspect ratio vias through the substrate.

In accordance with the present invention, the vias are filled with a molecular material such as carbon nanotubes using, for instance, chemical vapor deposition (CVD) to create an electrically conductive path through the die. A nanotube is a molecule composed of carbon atoms formed in the shape of hollow cylinder. Molecular materials such as carbon nanotubes are advantageous because they conduct at high current densities without suffering electromigration failure. Carbon nanotubes also have high thermal conductivity, high electrical conductivity, are mechanically strong, and are chemically stable. Unlike copper, carbon nanotubes can absorb stress by bending, and so may be less likely to lead to damage than existing packaging configurations. Since the thermal conductivity of carbon nanotubes is much greater than copper, via filled with nanotubes can more readily dissipate heat generated by the integrated circuits, thus reducing the heat problem that can arise when integrated circuit dies are vertically stacked.

Prior to formation of the carbon nanotubes, a catalyst material 105 is selectively deposited into the via so that it covers the lower surface of the via. In FIG. 1 the catalyst material 105 is located on the upper surface of die $102_2$ and is in contact with interconnect region $103_2$. Catalyst material 105 may comprise, for example, titanium or cobalt, and may be deposited by plating or other appropriate method.

The carbon nanotubes may then be selectively deposited onto the catalyst 105 using, for instance, chemical vapor deposition (CVD), laser ablation, or arc-discharge techniques. The CVD process involves heating a material to a high temperature in a reactor and flowing a hydrocarbon gas through the reactor for a period of time. Arc-discharge and laser ablation rely on evaporating carbon atoms from solid carbon sources at a very high temperature. These techniques are inherently disadvantageous, however, because solid carbon vaporization via electric arc or laser apparatus is both costly and difficult to operate on commercial or industrial scales. For this reason CVD will often be preferred. The nanotubes may be single-wall or multi-wall carbon nanotubes. Since the vias define the desired growth direction for the nanotubes, no template or electric field is necessary. Any excess nanotube material that may be formed on the surface of the die may be removed at the completion of the CVD process by a plasma stripping process in which an oxygen plasma is used to oxidize the material to form $CO_2$. In this same way a recess may be formed in the nanotube material at the top of the via so that a bond pad may be applied.

Among other advantages, when the carbon nanotubes are formed by CVD, its growth rate may be upwards of ten times greater than the growth rate of copper by an electroplating process. In addition, removal of excess material at the entrance to the via by chemical mechanical polishing (CMP) can be performed in an order of magnitude less time for a carbon nanotube filled via than for a copper filled via.

Although carbon nanotubes formed in the aforementioned manner can have high electrical conductivities, the contact resistance between the carbon nanotubes and the catalyst 105 can be quite high. The contact resistance can be reduced, however, by annealing the structure at temperatures of 600° C. or more. Unfortunately, temperatures this high will damage the metal interconnections located within each individual die, which generally can withstand temperatures only up to about 450° C.

In some embodiments of the present invention the contact resistance between the carbon nanotubes and the catalyst is reduced by the use of a laser annealing technique. As those of ordinary skill in the art will recognize, laser annealing can provide very localized heating. If the laser beam size is smaller than the diameter of the vias, the beam can be directed onto the via without affecting the remainder of the die. For instance, if the vias have a width on the order of about 70 nm, a beam width a few tens of nanometers may be employed. The beam may be directed onto the upper surface of the carbon nanontubes that fill via. Because of the high thermal conductivity of the nanotubes, the heat that is generated will be conducted to the nanotube/catalyst interface, thereby elevating the temperature of the interface to cause annealing. By directing the beam onto such a localized portion of the die, damage to the remainder of the die, particularly the metal interconnects, can be avoided.

Lasers that may be used for the annealing process have suitable wavelengths, pulse lengths, pulse shapes, and pulse energy stability in order to remain within the optimum parameter space for the target process. The lasers may generate cw or pulsed beams. The appropriate wavelength may chose in part based on the depth between the surface of the carbon nanotubes and the interface that is to be heated. The amount of output energy needed for the laser annealing process of the present invention depends upon a variety of factors and may be determined empirically or by other means. In some embodiments, output energy in the range of about 0.1 K watt/mm$^2$ to about 0.8 K watt/mm$^2$ may be used. In some embodiments, the laser annealing process has a pulse repetition rate of about 10 Hz or greater. In some embodiments of the present invention, the pulse repetition rate of the laser is determined by the duty cycle of the laser. In general, any appropriate laser may be employed that can raise the temperature at the nanotube/catalyst interface to about 600° C. or more.

Figure 2A:
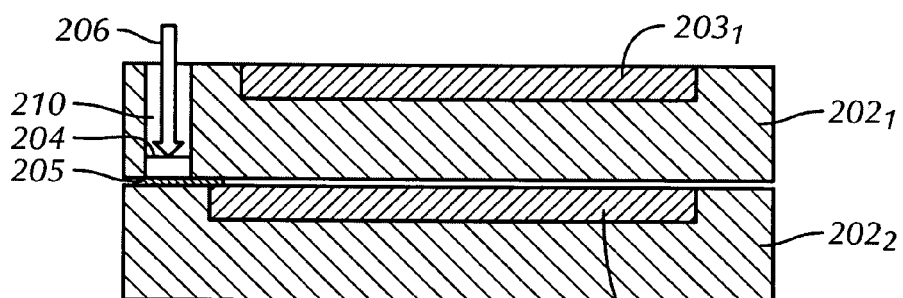
FIGS. 2(a)-2(c) show alternative embodiments of the invention.

In some embodiments of the invention, such as depicted in FIG. 2(a), for example, the laser anneal may be performed after the via 210 is only partially (e.g., half) filled with the conductive nanotubes. In this way the heat that is generated can be more readily conducted to the catalyst interface. After the anneal is completed, the remainder of the via can be filled with the nanotubes. In FIG. 2(a), reference numeral 204 denotes the upper surface of the carbon nanotubes in via 210 of chip 202$_1$, at which point laser beam 206 is applied.

Figure 2B:
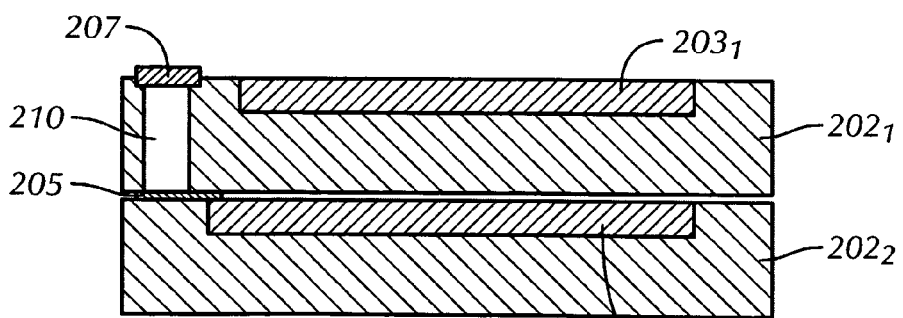
Figure 2C:
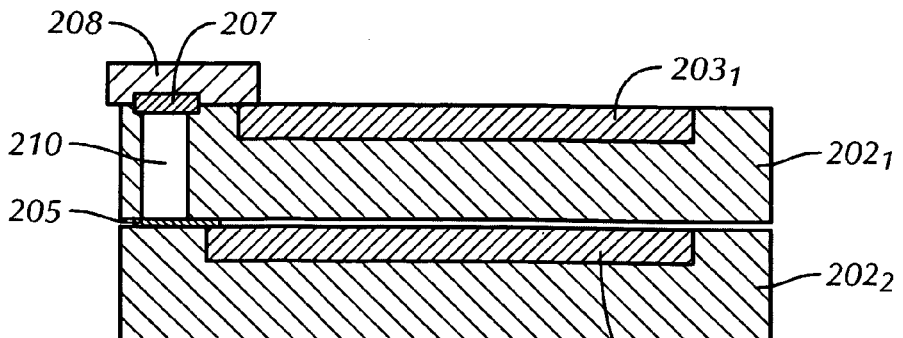

In yet another embodiment of the invention such as depicted in FIG. 2(b), after the carbon nanotubes are formed a bond pad 207 is formed on the nanotube surface. At this point the bond pad is largely thermally isolated from the interconnect region 203$_1$ of the upper die 102$_1$. The annealing process may now be performed by applying the laser beam to the bond pad 207. Only after the anneal is completed is the bond pad 207 wired to the interconnect region 203$_1$ by wire 208 (see FIG. 2(c)). In this way heat will not be conducted to the interconnect region in an amount sufficient to damage the metal interconnects therein.

The invention claimed is:

1. A method for interconnecting a plurality of semiconductor chips, comprising:
    forming at least one via through the thickness of at least a first one of the semiconductor chips;
    vertically stacking the first semiconductor chip over a second semiconductor chip such that a bottom of the via is exposed to a conductive interconnect region of the second semiconductor chip;
    forming a catalyst layer at the bottom of the via, said catalyst layer being electrically interconnected to a conductive interconnect region of the second semiconductor chip;
    filling the via with a carbon nanotube conductor;
    forming a contact metal pad on a top surface of the carbon nanotube conductor, said contact metal pad thermally isolated from a conductive interconnect region of the first semiconductor chip;
    annealing an interface defined by the top surface of the carbon nanotube conductor and the contact metal pad;
    wiring the contact metal pad and the conductive interconnect region of the first semiconductor chip after said annealing step; and
    further comprising the step of using an oxygen plasma process to remove excess nanotube material from the top surface of the first semiconductor chip, wherein said step of using an oxygen plasma process forms a recess in a top surface of the nanotube material.

2. The method of claim 1 wherein the annealing step is performed by a laser beam, wherein the laser beam size is smaller than the diameter of the via.

3. The method of claim 2 wherein said laser beam is applied to a surface of the contact metal pad.

4. The method of claim 1 herein the step of filling the via with the carbon nanotube conductor comprises using a CVD process to fill the via.

5. The method of claim 1 further comprising the step of securing the first semiconductor chip to the second semiconductor chip with an adhesive.

6. The method of claim 1, wherein said annealing step also anneals an interface defined by the carbon nanotube conductor and the catalyst layer.

* * * * *